United States Patent
Hanlon et al.

(10) Patent No.: US 8,219,909 B2
(45) Date of Patent: Jul. 10, 2012

(54) HUMAN-MACHINE INTERFACE WITH INTEGRATED POSITION SENSORS AND PASSIVE HAPTIC FEEDBACK DEVICES

(75) Inventors: Casey Hanlon, Queen Creek, AZ (US); Cal Potter, Mesa, AZ (US); Paul Wingett, Mesa, AZ (US)

(73) Assignee: Honeywell International Inc., Morristown, NJ (US)

( * ) Notice: Subject to any disclaimer, the term of this patent is extended or adjusted under 35 U.S.C. 154(b) by 837 days.

(21) Appl. No.: 12/359,946

(22) Filed: Jan. 26, 2009

(65) Prior Publication Data
US 2010/0188267 A1    Jul. 29, 2010

(51) Int. Cl.
*G06F 3/00* (2006.01)
(52) U.S. Cl. .......... 715/701; 341/20; 345/156; 345/157; 715/702; 74/471 XY
(58) Field of Classification Search .................... 341/20; 345/156–157; 715/701–702; 74/471 XY
See application file for complete search history.

(56) References Cited

U.S. PATENT DOCUMENTS

| | | |
|---|---|---|
| 3,904,163 A | 9/1975 | Kendy et al. |
| 4,124,787 A | 11/1978 | Aamoth et al. |
| 4,646,087 A | 2/1987 | Schumann |
| 4,946,421 A | 8/1990 | Kerley, Jr. |
| 4,947,701 A | 8/1990 | Hegg |
| 5,113,714 A | 5/1992 | Eklund et al. |
| 5,349,881 A | 9/1994 | Olorenshaw et al. |
| 5,377,950 A | 1/1995 | Salcudean et al. |
| 5,675,359 A | 10/1997 | Anderson |
| 6,477,912 B2 | 11/2002 | Song et al. |
| 6,593,729 B2 | 7/2003 | Sundin |
| 6,593,912 B1 | 7/2003 | Smith et al. |
| 6,681,880 B2 | 1/2004 | Bernhardt et al. |
| 7,204,168 B2 | 4/2007 | Najafi et al. |
| 7,474,296 B2 * | 1/2009 | Obermeyer et al. .......... 345/156 |
| 2002/0033841 A1 * | 3/2002 | Rosenberg .................... 345/701 |
| 2002/0174736 A1 | 11/2002 | Chapman |
| 2008/0156939 A1 | 7/2008 | Hanlon et al. |

* cited by examiner

*Primary Examiner* — Albert Wong
(74) *Attorney, Agent, or Firm* — Ingrassia Fisher & Lorenz, P.C.

(57) ABSTRACT

A system and method for determining the input force supplied to a user interface by a user is provided. A passive feedback mechanism is coupled to the user interface, and a change in position of the passive feedback mechanism is sensed. The input force supplied by the user to the user interface is then calculated from the sensed change in position.

20 Claims, 2 Drawing Sheets

HUMAN-MACHINE INTERFACE WITH INTEGRATED POSITION SENSORS AND PASSIVE HAPTIC FEEDBACK DEVICES

TECHNICAL FIELD

The present invention generally relates to, human-machine interfaces and, more particularly, to human-machine interfaces that employ passive haptic feedback/re-centering devices.

BACKGROUND

Human-machine interfaces that are used to translate human movements to machine movements are used in myriad industries. For example, some rotary wing and fixed-wing aircraft flight control systems include a human-machine interface in the form of one or more control sticks, pedals, yokes, or other devices. The flight control system, in response to input forces supplied to the interface(s) from the pilot, controls the movements of various aircraft flight control surfaces. No matter the particular end-use system, the human-machine interface preferably includes some type of haptic feedback mechanism back through the interface to the interface operator. These haptic feedback mechanisms may be implemented using active devices, passive devices, or both.

In many applications, such as civilian and military aircraft, the haptic feedback mechanisms are implemented using both active devices and passive devices. The active devices are typically the primary haptic means of providing haptic feedback, while the passive devices are included as a back up in the unlikely event the active devices become unavailable or otherwise inoperable. The active feedback mechanisms may be implemented using redundant force and position sensors. Although these types of haptic feedback mechanisms are generally safe and reliable, they do suffer certain drawbacks. For example, the force sensors that are typically used are relatively high-fidelity force sensors, which increase overall system cost and complexity. Moreover, when redundancy is employed to increase overall system reliability, the increased cost and complexity can be significant.

Hence, there is a need for an active human-machine interface haptic feedback system that exhibits suitable fidelity and/or redundancy, without significantly impacting overall system cost and complexity. The present invention addresses at least this need.

BRIEF SUMMARY

In one embodiment, and by way of example only, an active human-machine interface system includes a user interface, a passive force feedback mechanism, a position sensor, and a circuit. The user interface is configured to receive input force from a user and, upon receipt thereof, to move from a null position to a control position. The passive force feedback mechanism is coupled to the user interface and is configured to supply passive feedback force to the user interface at least when the user interface is moved from the null position. The position sensor is coupled to the passive force feedback mechanism, and is operable to sense passive force feedback mechanism position and supply a position signal representative thereof. The circuit is coupled to receive at least the passive force feedback mechanism position signal and is operable, in response thereto, to calculate the input force using the position signal.

In another exemplary embodiment, an active human-machine interface system includes a user interface, a plurality of springs, a plurality of position sensors, a plurality of motors, and a circuit. The user interface is configured to receive input force from a user and, upon receipt thereof, to move from a null position to a control position. The plurality of springs is coupled to the user interface. Each spring is configured to supply passive feedback force to the user interface at least when the user interface is moved from the null position. Each position sensor is coupled to one of the springs and is operable to sense a position of the spring and supply a position signal representative thereof. Each motor is coupled to the user interface, and is configured to be controllably energized and is operable, in response thereto, to supply active force feedback to the user interface. The circuit is coupled to receive at least the spring position signals and is operable, in response thereto, to calculate the input force using the position signals and, based on the calculated input force, to controllably energize each motor.

In yet a further exemplary embodiment, a method of determining input force supplied to a user interface by a user includes coupling a passive feedback mechanism to the user interface, sensing a change in position of the passive feedback mechanism, and calculating the input force supplied by the user to the user interface from the sensed change in position.

Furthermore, other desirable features and characteristics of the human-machine interface system and method will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any theory presented in the preceding background or the following detailed description. In this regard, although the following description is, for convenience, directed to a user interface that is configured as a control stick type of pilot inceptor, it will be appreciated that the user interface could be implemented as a pedal, yoke, lever, and the like.

Figure 1:
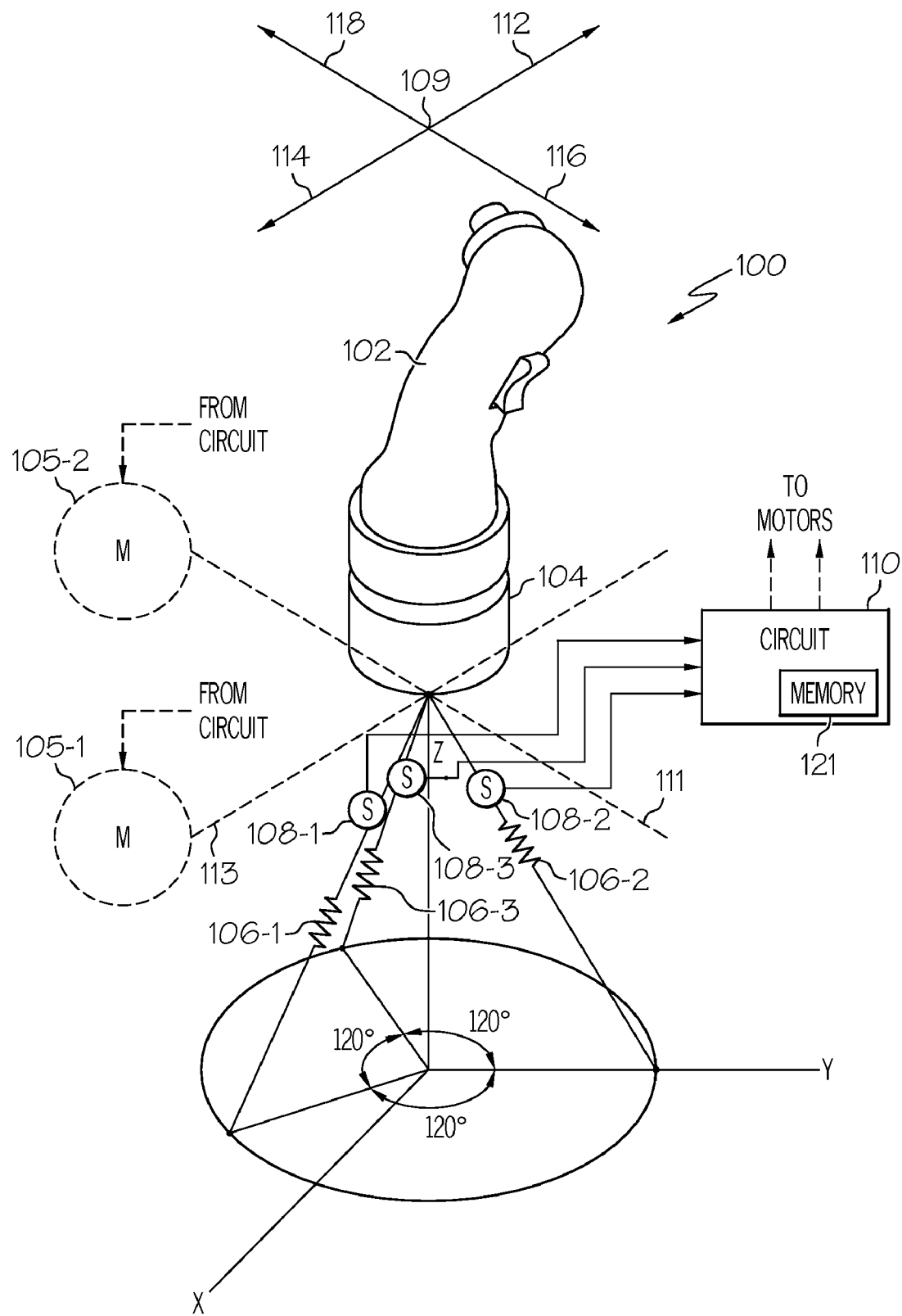
FIG. 1 depicts a simplified representation of an exemplary embodiment of a portion of a human-machine interface system.

A simplified representation of an exemplary embodiment of a portion of a human-machine interface system 100 is depicted in FIG. 1, and includes a user interface 102, a multi-degree-of-freedom (MDOF) assembly 104, a plurality of passive force feedback mechanisms 106, a plurality of position sensors 108, and a circuit 110. The user interface 102 is coupled to the MDOF assembly 104 and is configured to receive input force from a user. The user interface 102 may be implemented according to any one of numerous configurations. In the depicted embodiment, however, it is implemented as a grip, or control stick, that is preferably dimensioned to be grasped by a hand of a user, such as a pilot (or co-pilot).

The MDOF assembly 104 is configured to allow the user interface 102 to be moved, with multiple degrees of freedom, from a null position 109, which is the position depicted in FIG. 1, to a plurality of control positions. In this regard the MDOF assembly 104 may be implemented as any one of numerous assemblies that allow for movement of a user interface with multiple degrees of freedom. For example, the MDOF assembly 104 may be any one of numerous six-degree-of-freedom (e.g., "6dof") assemblies, any one of numerous three-degree-of-freedom ("3dof") assemblies, or any one of numerous two-degree-of-freedom ("2dof") assemblies, just to name a few non-limiting examples.

In the depicted embodiment, the MDOF assembly 104 is implemented as a conventional 2dof assembly. As such, the MDOF assembly 104, in response to input force supplied to the user interface 102, allows the user interface 102 to be moved from the null position 109 to a plurality of control positions, about two perpendicular rotational axes—a first rotational axis 111 and a second rotational axis 113. It will be appreciated that if the human-machine interface system 100 is implemented as an aircraft flight control human-machine interface system, such as a pilot (or co-pilot) inceptor, then the first and second rotational axes 111, 113 may be referred to as the roll axis and the pitch axis, respectively.

No matter the specific end use of the depicted human-machine interface system 100, the MDOF assembly 104 is configured to allow the user interface 102 to be movable about the first rotational axis 111 in a port direction 112 and a starboard direction 114, and about the second axis 113 in a forward direction 116 and an aft direction 118. It will additionally be appreciated that the MDOF assembly 104 is configured to allow the user interface 102 to be simultaneously rotated about the first and second rotational axes 111, 113 to move the user interface 102 in a combined forward-port direction, a combined forward-starboard direction, a combined aft-port direction, or a combined aft-starboard direction, and back to or through the null position 109. Once again, it should be appreciated that the MDOF assembly 104 is not limited to the 2dof assembly depicted in FIG. 1 and described herein, but may be configured using any one of numerous MDOF assembly implementations now known or developed in the future. Furthermore, detailed description of the useable MDOF assemblies 104 are not needed to fully enable or describe the invention, and will thus not be provided.

The human-machine interface system 100 may be implemented as either an active system or a passive system. If implemented as an active system, the human-machine interface system 100 further includes one or more motors, such as the motors 105 (e.g., 105-1, 105-2) depicted in phantom in FIG. 1. The motors 105, if included, are configured to be controllably energized and are operable, upon being controllably energized, to supply active force feedback to the user interface 102. If implemented as a passive system, it will be appreciated that the system 100 would not include any motors 105. In either instance, however, the system 100 would preferably include the passive feedback mechanisms 106. In the case of the active system, the motors 105 would be the primary means of supplying feedback force to the user interfaces 102, with the passive force feedback mechanisms 106 being the back-up feedback force source.

The passive force feedback mechanisms 106, which are schematically illustrated, include a first passive force feedback mechanism 106-1, a second passive force feedback mechanism 106-2, and a third passive force feedback mechanism 106-3. The passive force feedback mechanisms 106 are each coupled to the user interface 102 and are each configured to supply passive feedback force to the user interface 102 at least when the user interface 102 is moved from the null position 109. That is, whenever the user interface 102 is moved from the null position 109, the passive force feedback mechanisms 106 supply a feedback force to the user interface 102 that urges the user interface 102 back toward the null position 109. It will be appreciated that the passive force feedback mechanisms 106 may be implemented using any one of numerous suitable devices, but in the depicted embodiment each is implemented using a spring.

As is generally known, the spring force supplied by a spring may be calculated using Hooke's Law:

$$F = -kx,$$

where F is the spring force, k is the spring constant, and x is the distance that the spring has been stretched or compressed away from the equilibrium position. Hence, if the spring constant of each spring 106 is known, and the distance that each spring has been stretched or compressed is measured, then the spring force that each spring is supplying to the user interface 102 may be readily calculated. Because the sum of the forces and the sum of the moments of a body in equilibrium equal zero, the resultant force and direction can be calculated using conventional vector analysis. Moreover, the rate-of-change of force (e.g., dF/dt) can be calculated based on the update rate of the system.

The distance that each spring has been stretched or compressed is determined using each of the position sensors 108. More specifically, the system 100 includes one position sensor 108 per passive feedback mechanism 106. Thus, in the depicted embodiment, the system 100 includes three position sensors 108-1, 108-2, 108-3. The position sensors 108 may be implemented using any one of numerous types of position sensors now known or developed in the future. One non-limiting example of a suitable position sensor that may be used is a linear variable differential transformer (LVDT). No matter the specific type of position sensor that is used, each position sensor 106 is coupled to one of the passive force feedback mechanisms 106, and is operable to sense passive force feedback mechanism position and supply a position signal representative thereof to the circuit 110.

The circuit 110 is coupled to receive each of the position signals supplied from each of the position sensors 108. The circuit 110, using the position signals and values of each of the spring constants stored, for example, in memory 121, calculates the force supplied by each passive feedback mechanism 106. Because the sum of the forces supplied by each passive feedback mechanism 106 is zero, the circuit 110 also calculates the input force supplied by a user to the user interface 102. The circuit 110 is also preferably configured to calculate the force rate-of-change. For those embodiments in which the human-machine interface system 100 is implemented as an active system, the circuit 110 may also be configured, based on the calculated input force, to controllably energize the motors 105 to supply active force feedback to the user interface 102. The circuit 110 may supply signals representative of the calculated force and force rate of change to one or more non-illustrated systems or devices. For example, in the context of an aircraft, the circuit may supply these signals to an aircraft flight computer.

Before proceeding further, it is noted that the human-machine interface system 100 depicted in FIG. 1 is based on the Cartesian coordinate frame-of-reference. It will be appreciated, however, that this is merely exemplary and that the system 100 could be implemented based on either polar or spherical coordinate reference frames.

Figure 2:
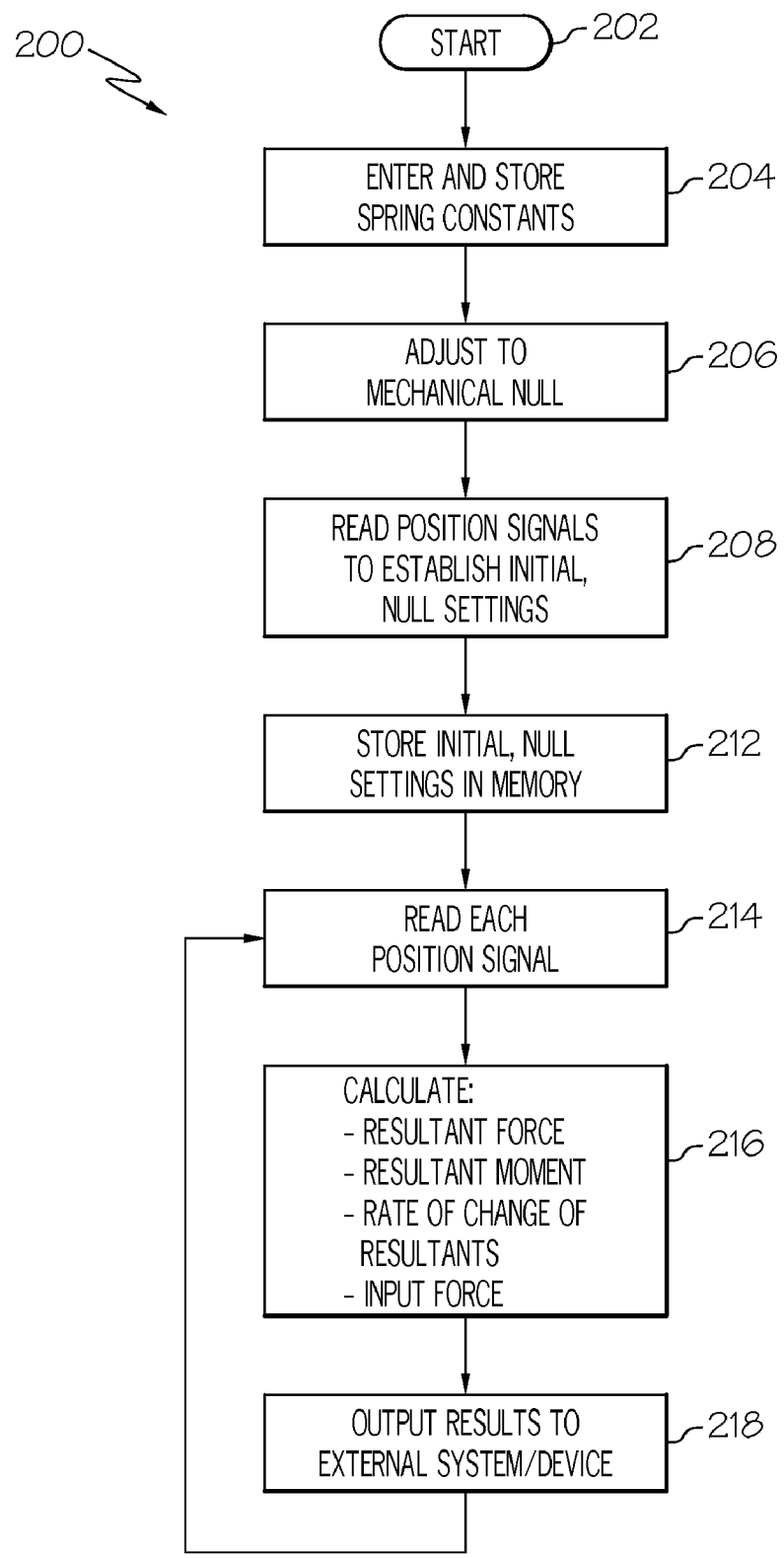
FIG. 2 depicts an exemplary process, in flowchart form, for initializing and operating the human-machine interface system of FIG. 1.

Referring now to FIG. 2, an exemplary process for initializing and operating the human-machine interface system 100 is depicted in flowchart form, and will now be described. In doing so, it should be noted that the parenthetical reference numerals in the following paragraphs correspond to like reference numerals in the flow chart. Upon system initialization (202), the spring constants (k) for each of the springs 106 is entered and stored in the memory 121 (204). The human-machine interface system 100 is adjusted to its mechanical null position 109 (206), and the circuit reads the position signals supplied by each of the position sensors 108 to establish initial, null position settings (208). These initial, null position settings are then stored in the memory 121 (212), and the human-machine interface system 100 is ready for operation.

During operation, the circuit 110 reads the position signals supplied by each of the position sensors 108 at the system update rate (214) to determine the position of each passive force feedback mechanism 106 relative to the initial, positions. Using the determined positions, the circuit 110 calculates the resultant force and moment of the user interface 102, the rate-of-change of force, and the input force (if any) being supplied by a user to the user interface 102 (216). Though not shown in FIG. 2, if the system 100 is implemented as an active system, the circuit 110, based on the calculated input force, may also controllably energize the motors 105 to supply active force feedback to the user interface 102. As described above, the circuit 110 may additionally supply signals representative of one or more of the performed calculations to an external system or device, such as a flight computer (218).

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. An active human-machine interface system, comprising:
a user interface configured to receive input force from a user and, upon receipt thereof, to move from a null position to a control position;
a passive force feedback mechanisms coupled to the user interface and configured to supply passive feedback force to the user interface at least when the user interface is moved from the null position;
a position sensor coupled to the passive force feedback mechanism, the position sensor operable to sense passive force feedback mechanism position and supply a position signal representative thereof; and
a circuit coupled to receive at least the passive force feedback mechanism position signal and operable, in response thereto, to calculate the input force using the position signal.

2. The system of claim 1, further comprising:
a motor coupled to the user interface, the motor further configured to be controllably energized and operable, in response thereto, to supply active force feedback to the user interface,
wherein the circuit is further operable, based on the calculated input force, to controllably energize the motor.

3. The system of claim 1, wherein:
the passive force feedback mechanism comprises a plurality of springs; and
the position sensor comprises a plurality of position sensors, each position sensor coupled to one of the springs and operable to supply a position signal representative thereof.

4. The system of claim 2, wherein:
each spring has an associated spring constant; and
the system further comprises memory having each associated spring constant stored therein.

5. The system of claim 1, wherein the circuit is further operable to continuously determine passive force feedback mechanism position.

6. The system of claim 5, wherein the circuit is further operable to continuously determine passive force feedback mechanism change of position.

7. The system of claim 1, wherein the circuit is further operable to calculate input force rate of change using the position signal.

8. The system of claim 1, wherein:
the user interface is configured to rotate, from a null position, about a first rotational axis and a second rotational axis, the second rotational axis perpendicular to the first rotational axis; and
the user interface is responsive to the input force, to rotate, from the null position to the control position, about one or both of the first and second rotational axes.

9. The system of claim 8, wherein:
the passive force feedback mechanism comprises a plurality of springs;
the position sensor comprises a plurality of position sensors, each position sensor coupled to one of the springs and operable to supply a position signal representative thereof to the circuit; and
the circuit is operable to calculate the input force using each of the position signals.

10. The system of claim 8, wherein the circuit is further operable to calculate a rotational moment about the first and second rotational axes.

11. An active human-machine interface system, comprising:
a user interface configured to receive input force from a user and, upon receipt thereof, to move from a null position to a control position;
a plurality of springs coupled to the user interface, each spring configured to supply passive feedback force to the user interface at least when the user interface is moved from the null position;
a plurality of position sensors, each position sensor coupled to one of the springs and operable to sense a position of the spring and supply a position signal representative thereof;
a plurality of motors coupled to the user interface, each motor further configured to be controllably energized and operable, in response thereto, to supply active force feedback to the user interface; and
a circuit coupled to receive at least the spring position signals and operable, in response thereto, to calculate the input force using the position signals and, based on the calculated input force, to controllably energize each motor.

12. The system of claim 11, wherein:
each spring has an associated spring constant; and
the system further comprises memory having each associated spring constant stored therein.

13. The system of claim 1, wherein the circuit is further operable to continuously determine spring position.

14. The system of claim 13, wherein the circuit is further operable to continuously determine spring change of position.

15. The system of claim 11, wherein the circuit is further operable to calculate input force rate of change using the position signals.

16. The system of claim 11, wherein:
the user interface is configured to rotate, from a null position, about a first rotational axis and a second rotational axis, the second rotational axis perpendicular to the first rotational axis; and
the user interface is responsive to the input force, to rotate, from the null position to the control position, about one or both of the first and second rotational axes.

17. The system of claim 16, wherein the circuit is further operable to calculate a rotational moment about the first and second rotational axes.

18. A method of determining input force supplied to a user interface by a user, the method comprising the steps of:
coupling a passive feedback mechanism to the user interface;
sensing a change in position of the passive feedback mechanism; and
calculating the input force supplied by the user to the user interface from the sensed change in position.

19. The method of claim 18, further comprising controlling haptic feedback to the user interface based on the calculated input force.

20. The method of claim 18, wherein the passive feedback mechanism comprises one or more springs, and wherein the method further comprises:
coupling an electric motor to the user interface; and
controllably energizing the electric motor based on the calculated input force.

* * * * *